United States Patent
Rahman et al.

(10) Patent No.: US 9,082,473 B2
(45) Date of Patent: Jul. 14, 2015

(54) POWER SUPPLY BROWNOUT PROTECTION CIRCUIT AND METHOD FOR EMBEDDED FRAM

(71) Applicant: Texas Instruments Incorporated, Dallas, TX (US)

(72) Inventors: Abidur Rahman, Allen, TX (US); Tatsuyuki Nihei, Tokyo (JP); Tatsuro Sato, Tokyo (JP); Uchino Osamu, Sizuoka (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 330 days.

(21) Appl. No.: 13/785,583

(22) Filed: Mar. 5, 2013

(65) Prior Publication Data

US 2014/0254235 A1 Sep. 11, 2014

(51) Int. Cl.
*G11C 11/22* (2006.01)
*G11C 5/14* (2006.01)

(52) U.S. Cl.
CPC .................................. *G11C 5/148* (2013.01)

(58) Field of Classification Search
USPC ......................................... 365/145, 206, 149
See application file for complete search history.

(56) References Cited

U.S. PATENT DOCUMENTS

| 6,088,257 A | 7/2000 | Jeon et al. |
|---|---|---|
| 6,201,731 B1 | 3/2001 | Kamp et al. |
| 2011/0198725 A1* | 8/2011 | Roest et al. ................... 257/532 |
| 2012/0155144 A1 | 6/2012 | Xia et al. |

OTHER PUBLICATIONS

"FRAM", Fujitsu FRAM Quality & Reliability, Copyright 1995-2012 Fujitsu, 10 pages.
Ferroelectric RAM, from Wikipedia, the free encyclopedia, 6 pages.

* cited by examiner

*Primary Examiner* — Vu Le
(74) *Attorney, Agent, or Firm* — Alan A. R. Cooper; Frank D. Cimino (57) ABSTRACT

Corruption of data in a FRAM (2) is avoided by applying a regulated voltage ($V_{LDO}$) to a conductive pin (5-1). A switch (SW1) is coupled between the conductive pin and a power terminal of the FRAM so a FRAM supply voltage ($V_{FRAM}$) is equal to the regulated voltage when the switch is closed. The conductive pin is coupled to a power terminal of a digital circuit (3) so a digital circuit supply voltage ($V_{CORE}$) is equal to the regulated voltage. A power interruption is detected to produce an interruption signal (nBORdet) that opens the switch and also prevents starting of new read and write operations in the FRAM. A sufficient FRAM supply voltage is maintained by an internal capacitor ($C_{INT}$) while ongoing read and write operations in the FRAM are completed during a predetermined interval. The conductive pin may be coupled to the switch by bonding wire inductance ($L_{WIRE}$) between the switch and the conductive pin to inhibit flow of transient currents between them.

20 Claims, 3 Drawing Sheets

POWER SUPPLY BROWNOUT PROTECTION CIRCUIT AND METHOD FOR EMBEDDED FRAM

BACKGROUND OF THE INVENTION

The present invention relates generally to FRAMs (ferroelectric random access memories), and more particularly to improved circuits and methods for preventing corruption of data in FRAMs due to power interruptions.

FRAMs (also known as FeRAMs) are generally considered to be "non-volatile" because they continue to store data even if their operating power is interrupted. FRAM by nature is characterized by "destructive readout", which means that any time a FRAM memory cell undergoes a read operation its stored information is destroyed, and therefore the corresponding readout information must be rewritten back into that FRAM memory cell.

The power applied to a FRAM may be "interrupted", i.e., may undergo a transition to a level outside of an acceptable range, because of a disruption in the main power being applied to a system that contains the FRAM. The power applied to the FRAM also may be interrupted in some cases if there is an external short-circuiting of a package pin or pad to ground, or possibly if someone succeeds in hacking into a system containing the FRAM in such a way as to cause an interruption in the power supplied to the FRAM. Data stored in the FRAM will be corrupted and permanently lost if ordinary memory read and write operations occur while the power applied to the FRAM is being interrupted. As an example, if the operating power supply voltage $V_{FRAM}$ applied to the FRAM and associated read/write/rewrite circuitry is equal to 1.8 volts, and if during a power interruption $V_{FRAM}$ falls below approximately 1.6 volts, data involved in any on-going read and write operations will be corrupted.

Figure 1A:
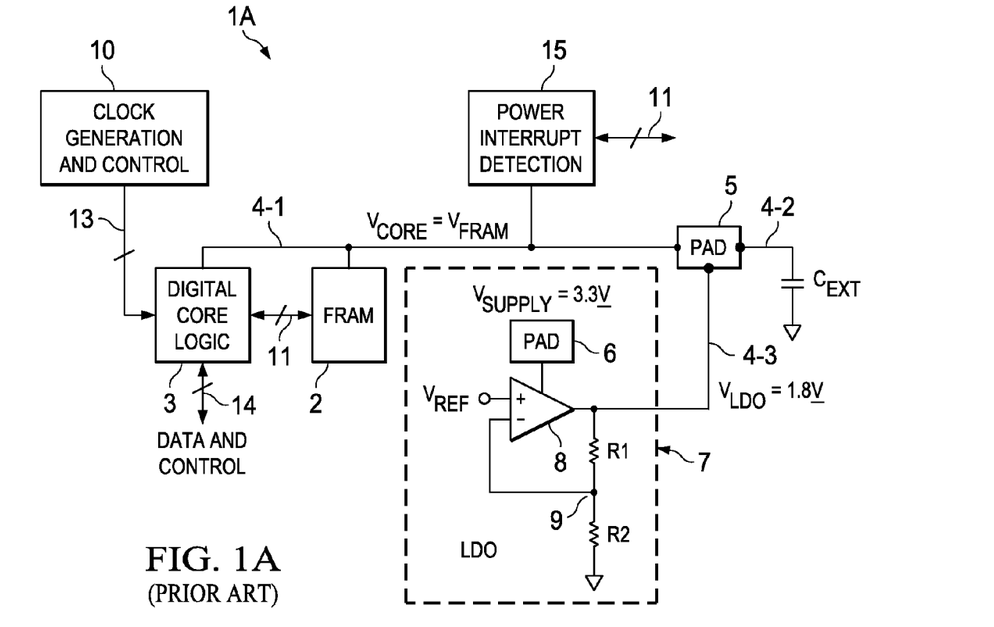
FIG. 1A is a block diagram of a known FRAM memory system including digital core logic, a FRAM, and a large external bypass capacitor for providing temporary backup power to the digital core logic and FRAM during a main power interruption.

Referring to FIG. 1A, a known system 1A including an "embedded" FRAM 2 also includes digital core logic 3 that is coupled by means of a bidirectional bus 11 to FRAM 2. Digital core logic 3 is coupled to an external digital system (not shown) by means of a bidirectional data and control bus 14. FRAM 2 and digital core logic 3 both are powered by a supply voltage $V_{CORE}$ which may also be referred to as $V_{FRAM}$, on conductor 4-1. Digital core logic 3 is coupled by a digital bus 13 to a clock generation and control circuit 10. Conductor 4-1 is coupled to a conductive integrated circuit package pad or pin 5 on the integrated circuit chip on which FRAM memory system 1A is fabricated. The desired supply voltage $V_{FRAM}$ applied to digital core logic 3 and FRAM 2 is generated on conductive pad 5 by means of a LDO (Low Drop Out) regulator circuit 7, the output of which is connected to a conductor 4-3. LDO voltage regulator 7 includes an operational amplifier 8 having its (+) input coupled to a reference voltage $V_{REF}$ and its (−) input coupled by conductor 9 to the junction between a voltage divider including resistor R1 and resistor R2. The output of amplifier 8 is connected by conductor 4-3 to apply a regulated output voltage $V_{LDO}$ across resistive voltage divider R1,R2. The regulated output voltage $V_{LDO}$ thus is applied to conductive pad 5, which also is connected to FRAM 2 and digital core logic 3 by conductor 4-1. Conductive pad 5 also is connected by conductor 4-2 to a large external bypass capacitor $C_{EXT}$.

In this example, amplifier 8 is powered by a main supply voltage $V_{SUPPLY}$, which is applied to a conductive bonding pad 6. $V_{REF}$ may be equal to 1.8 volts, so $V_{LDO}$ is regulated to 1.8 volts. Therefore, the FRAM supply voltage $V_{FRAM}$, which is also the supply voltage for digital core logic 3, is also equal to 1.8 V. $C_{EXT}$ is very large, and may for example be equal to 2.2 microfarads. A suitable power interrupt detection circuit 15 detects the voltage $V_{FRAM}=V_{CORE}$ on conductor 4-1. If a power interruption is detected, power interrupt detection circuit 15 communicates with digital core logic 3 via bus 11, causing it to operate so as to (1) prevent any new FRAM read, write, or rewrite operations from being started, and (2) to complete any already-started read and write operations within a predetermined time interval after the detection of the FRAM power interruption, to thereby prevent corruption of FRAM data.

One problem with the system shown in FIG. 1A is that whenever $V_{SUPPLY}$ is interrupted, the 1.8 volt memory supply voltage $V_{LDO}=V_{FRAM}$ will also be interrupted, causing corruption of any FRAM data involved in any new or ongoing read, write, or rewrite operation in FRAM 2. Another problem is that whenever the external conductive pad or pin 5 is inadvertently short-circuited to ground, the 1.8 volt memory supply voltage $V_{FRAM}$ is likely to fall below 1.6 V, likely causing corruption of data involved in any on-going or subsequent read and write operations in FRAM 2 during the power interruption.

To overcome the foregoing data corruption problems in this example, the external bypass capacitor $C_{EXT}$ must maintain the supply voltage $V_{FRAM}$ coupled to both digital core logic 3 and FRAM 2 above 1.6 volts for a sufficiently long interval, for example at least 200 ns (nanoseconds), to allow completion of all on-going FRAM read and write operations. During that 200 ns interval, digital core logic 3 and FRAM 2 drain a large amount of current from external bypass capacitor $C_{EXT}$, which must be sufficiently large to maintain $V_{FRAM}$ above 1.6 volts to prevent corruption of data in FRAM 2 during the 200 ns interval.

Figure 1B:
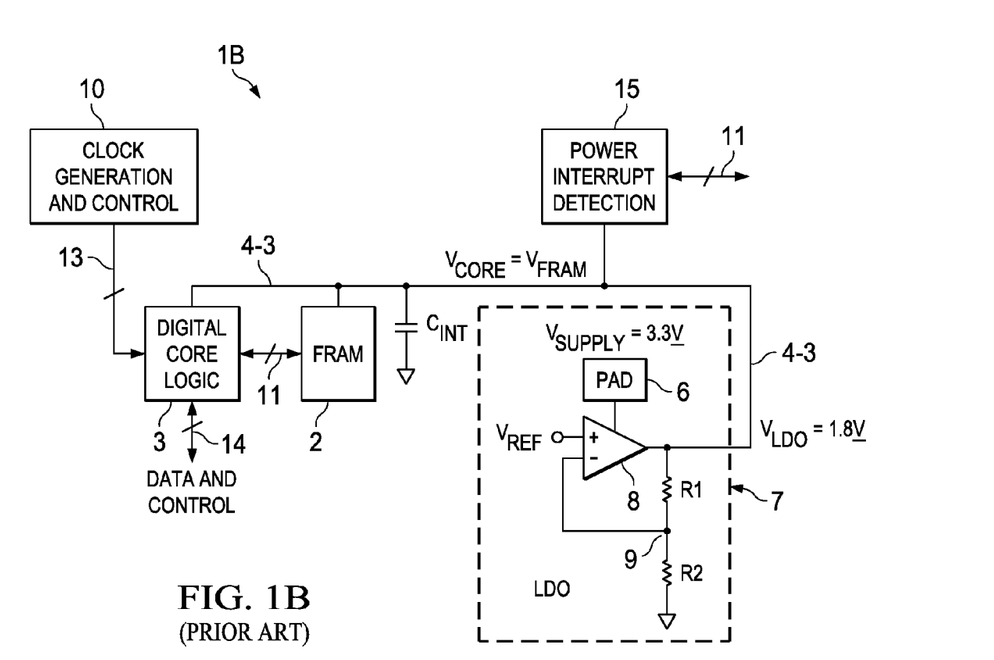
FIG. 1B is a block diagram of another known FRAM memory system including digital core logic, an embedded FRAM, and a large internal bypass capacitor for providing temporary backup power to the digital core logic and embedded FRAM during a main power interruption.

Referring to FIG. 1B, the illustrated system 1B is essentially the same as the system 1A shown in FIG. 1A except that conductive pin 5 is omitted and the output voltage $V_{LDO}$ of LDO regulator 1A is connected directly by conductor 4-3 to the supply voltage terminals of FRAM 2 and digital core logic 3. In this case, the external storage capacitor $C_{INT}$ of FIG. 1A is omitted, and instead an internal storage capacitor $C_{INT}$ is coupled between conductor 4-3 and ground and is included on the integrated circuit chip on which system 1B is fabricated. Unfortunately, this technique is very costly because the required very large internal storage voltage capacitor $C_{INT}$ requires a great deal of integrated circuit chip area.

Thus, there is an unmet need for an improved circuit and method for preventing corruption of data stored in a FRAM during an unexpected supply voltage interruption.

There also is an unmet need for a more efficient circuit and method for preventing corruption of data stored in a FRAM during an unexpected supply voltage interruption.

There also is an unmet need for a less costly circuit and method for preventing corruption of data stored in a FRAM during an unexpected supply voltage interruption.

There also is an unmet need for an improved, more efficient circuit and method for preventing corruption of data stored in a FRAM during an unexpected supply voltage interruption, wherein the circuit and method require substantially less integrated circuit chip area than in the prior art.

SUMMARY OF THE INVENTION

It is an object of the invention to provide an improved circuit and method for preventing corruption of data stored in a FRAM during an unexpected supply voltage interruption.

It is another object of the invention to provide a more efficient circuit and method for preventing corruption of data stored in a FRAM during an unexpected supply voltage interruption.

It is another object of the invention to provide a less costly circuit and method for preventing corruption of data stored in a FRAM during an unexpected supply voltage interruption.

It is another object of the invention to provide an improved, more efficient circuit and method for preventing corruption of data stored in a FRAM during an unexpected supply voltage interruption, wherein the circuit and method require substantially less integrated circuit chip area than in the closest prior art.

Briefly described, and in accordance with one embodiment, the present invention avoids corruption of data in a FRAM (2) by applying a regulated voltage ($V_{LDO}$) to a conductive pin or pad (5-1), wherein a switch (SW1) is coupled between the conductive pin and a power terminal of the FRAM so a FRAM supply voltage ($V_{FRAM}$) is equal to the regulated voltage when the switch is closed. The conductive pin is coupled to a power terminal of a digital circuit (3) so a digital circuit supply voltage ($V_{CORE}$) is equal to the regulated voltage. A power interruption is detected to produce an interruption signal (nBORdet) that opens the switch and also prevents starting of any new read and write operations in the FRAM. A sufficient FRAM supply voltage is maintained by an internal capacitor ($C_{INT}$) while ongoing read and write operations in the FRAM are completed during a predetermined interval. The conductive pin may be coupled to the switch by bonding wire inductance ($L_{WIRE}$) between the switch and the conductive pin to inhibit flow of transient currents between them.

In one embodiment, the invention provides a FRAM (ferroelectric random access memory) system including a FRAM (2); a digital circuit (3) coupled to the FRAM (2) for controlling read and write operations in the FRAM (2); a first supply voltage conductor (4-1) coupled to the digital circuit (3) for applying a first supply voltage ($V_{CORE}$) to the digital circuit (3) and also coupled to a conductive pin (5-1) that conducts a second supply voltage ($V_{LDO}$) and is coupled to an external capacitor ($C_{EXT}$) so that a DC value of the first supply voltage ($V_{CORE}$) is substantially equal to a DC value of the second supply voltage ($V_{LDO}$). A second supply voltage conductor (4-4) is coupled to the FRAM (2) for applying a third supply voltage ($V_{FRAM}$) to the FRAM (2). A switch circuit (SW1) has a first terminal coupled by the second supply voltage conductor (4-4) to an internal capacitor ($C_{INT}$) and a second terminal coupled to the conductive pin (5-1) so that a DC value of the third supply voltage ($V_{FRAM}$) is substantially equal to the DC value of the second supply voltage ($V_{LDO}$) when the switch circuit (SW1) is closed. A power interrupt detection circuit (28) detects an interruption of the first supply voltage ($V_{CORE}$) to produce an interruption signal (nBORdet) and turns the switch circuit (SW1) off and causes the digital circuit (3) to operate in response to the interruption signal (nBORdet) to prevent initiating of any new read and write operations and to complete any ongoing read and write operations in response to the detecting of the interruption, wherein the internal capacitor ($C_{INT}$) maintains the third supply voltage ($V_{FRAM}$) above a predetermined level during the completing of ongoing read and write operations. Delay circuitry (32) for producing a delay signal (nBORdeg(RCdelay)) for resetting the FRAM (2) after the ongoing read and write operations have been completed.

In one embodiment, the switch circuit (SW1) is an MOS transistor having its gate coupled to an output of the power interrupt detection circuit (28).

In one embodiment, a first bonding wire (4-5) couples the second terminal of the switch circuit (SW1) to the conductive pin (5-1), wherein the first bonding wire (4-5) has a sufficiently large inductance ($L_{WIRE}$) to prevent transmission of high-speed transient signals between the second supply voltage conductor (4-4) and the conductive pin (5-1).

In one embodiment, the first supply voltage conductor (4-1) is coupled to the conductive pin (5-1) by a second bonding wire (4-6) having a sufficiently large inductance ($L_{WIRE}$) to prevent transmission of high-speed transient signals between the first supply voltage conductor (4-1) and the conductive pin (5-1). In one embodiment, a voltage regulator (7) produces the second supply voltage ($V_{LDO}$). The voltage regulator (7) receives a main supply voltage ($V_{SUPPLY}$) and an output of the voltage regulator (7) is coupled to the conductive pin (5-1) by a third bonding wire (4-3) having a sufficiently large inductance ($L_{WIRE}$) to prevent transmission of high-speed transient signals between the voltage regulator (7) and the conductive pin (5-1). The capacitance of the internal capacitor ($C_{INT}$) is substantially smaller than the capacitance of the external capacitor ($C_{EXT}$). The internal capacitor ($C_{INT}$) supplies power to the FRAM (2) while the switch circuit (SW1) is off.

In one embodiment, the external capacitor ($C_{EXT}$) maintains the first supply voltage ($V_{CORE}$) above the predetermined level during the completing of ongoing read and write operations.

In one embodiment, the power interrupt detection circuit (28) includes a first comparator (26) having a first input (+) coupled to receive a voltage representative of the first supply voltage ($V_{CORE}$) and a second input (−) coupled to a reference voltage ($V_{REF2}$) representative of a value of the first supply voltage ($V_{CORE}$) at which the first supply voltage ($V_{CORE}$) becomes interrupted. The power interrupt detection circuit (28) includes a second comparator (30) having a first input (+) coupled to receive a voltage representative of the main supply voltage ($V_{SUPPLY}$) and a second input (−) coupled to the reference voltage ($V_{REF2}$).

In one embodiment, deglitching circuitry (38,40,44) removes glitches from the interruption signal (nBORdet) to generate a corresponding deglitched interruption signal (nBORdeglm) a first level of which is utilized to stop a clock signal input to the digital circuit (3) to prevent the initiating of any new read and write operations and to cause a delay circuit (32) to provide a predetermined delay (e.g., 200 ns) for the FRAM (2) to complete the ongoing read and write operations.

In one embodiment, the power interrupt detection circuit (28) includes a gate (27) for performing a logical ORing function on output signals of the first (26) and second (30) comparators to generate the interruption signal (nBORdet). The delay circuitry (32) causes the delay signal (nBORdeg (RCdelay)) to initiate resetting the FRAM (2) at least approximately 200 ns after a leading edge of the interruption signal (nBORdet.)

In one embodiment, the invention provides a method for preventing corruption of data in a FRAM (ferroelectric random access memory) (2), including applying a regulated supply voltage ($V_{LDO}$) to a conductive pin (5-1); coupling the conductive pin (5-1) to a first terminal of a switch (SW1) and coupling a second terminal of the switch (SW1) to a power terminal (4-4) of the FRAM (2) so that a DC value of a FRAM supply voltage ($V_{FRAM}$) is substantially equal to a DC value of the regulated supply voltage ($V_{LDO}$) when the switch (SW1) is closed, and also coupling the conductive pin (5-1) to a power terminal (4-1) of a digital circuit (3) which controls read and write operations in the FRAM (2), so that a DC value of a digital circuit supply voltage ($V_{CORE}$) is substantially equal to the DC value of the regulated supply voltage ($V_{LDO}$); detecting an interruption of the digital circuit supply voltage ($V_{CORE}$) to produce an interruption signal (nBORdet), and in response to the detecting, both turning the switch (SW1) off and preventing initiation of any new read and write operations during the interruption; and maintaining the FRAM supply voltage ($V_{FRAM}$) above a predetermined level by means of an internal capacitor ($C_{INT}$) during a predetermined time interval (e.g., 200 ns) while completing ongoing read and write operations and maintaining the digital circuit supply voltage ($V_{CORE}$) above a predetermined level by means of an external capacitor ($C_{EXT}$) during the predetermined time interval.

In one embodiment, the method includes coupling the conductive pin (5-1) to the second terminal (4-4) of the switch (SW1) by means of a first bonding wire (4-5) so that an inductance ($L_{WIRE}$) of the first bonding wire (4-5) prevents transmission of high-speed transient signals between the FRAM (2) and the conductive pin (5-1).

In one embodiment, the method includes coupling the conductive pin (5-1) to the power terminal (4-4) of the digital circuit (3) by means of a second bonding wire (4-6) so that an inductance ($L_{WIRE}$) of the second bonding wire (4-6) prevents transmission of high-speed transient signals between the digital circuit (3) and the conductive pin (5-1).

In one embodiment, the method includes generating the regulated supply voltage ($V_{LDO}$) by means of a voltage regulator (7) that produces the regulated supply voltage ($V_{LDO}$) in response to a main supply voltage ($V_{SUPPLY}$), the method including coupling the second supply voltage ($V_{LDO}$) to the conductive pin (5-1) by means of a third bonding wire (4-3) having a sufficiently large inductance ($L_{WIRE}$) to prevent transmission of high-speed transient signals between the voltage regulator (7) and the conductive pin (5-1).

In one embodiment, the method includes comparing a voltage representative of the digital circuit supply voltage ($V_{CORE}$) with a reference voltage ($V_{REF2}$) representative value of the digital circuit supply voltage ($V_{CORE}$) at which the digital circuit supply voltage ($V_{CORE}$) becomes interrupted.

In one embodiment, the invention provides a system for preventing corruption of data in a FRAM (ferroelectric random access memory) (2), including means (7,4-3) for applying a regulated supply voltage ($V_{LDO}$) to a conductive pin (5-1); means (5-3,4-5) for coupling the conductive pin (5-1) to a first terminal of a switch (SW1) and coupling a second terminal of the switch (SW1) to a power terminal (4-4) of the FRAM (2) so that a DC value of a FRAM supply voltage ($V_{FRAM}$) is substantially equal to a DC value of the regulated supply voltage ($V_{LDO}$) when the switch (SW1) is closed, and also for coupling the conductive pin (5-1) to a power terminal (4-1) of a digital circuit (3), which controls read and write operations in the FRAM (2), so that a DC value of a digital circuit supply voltage ($V_{CORE}$) is substantially equal to the DC value of the regulated supply voltage ($V_{LDO}$); means (28) for detecting an interruption of the digital circuit supply voltage ($V_{CORE}$) to produce an interruption signal (nBORdet), and in response to the detecting, both turning the switch (SW1) off and preventing initiation of any new read and write operations during the interruption; and means (SW1,$C_{INT}$,32) for maintaining the FRAM supply voltage ($V_{FRAM}$) above a predetermined level by means of an internal capacitor ($C_{INT}$) during a predetermined time interval (e.g., 200 ns) while completing ongoing read and write operations and maintaining the digital circuit supply voltage ($V_{CORE}$) above a predetermined level by means of an external capacitor ($C_{EXT}$) during the predetermined time interval.

DETAILED DESCRIPTION OF THE PREFERRED EMBODIMENTS

Figure 2:
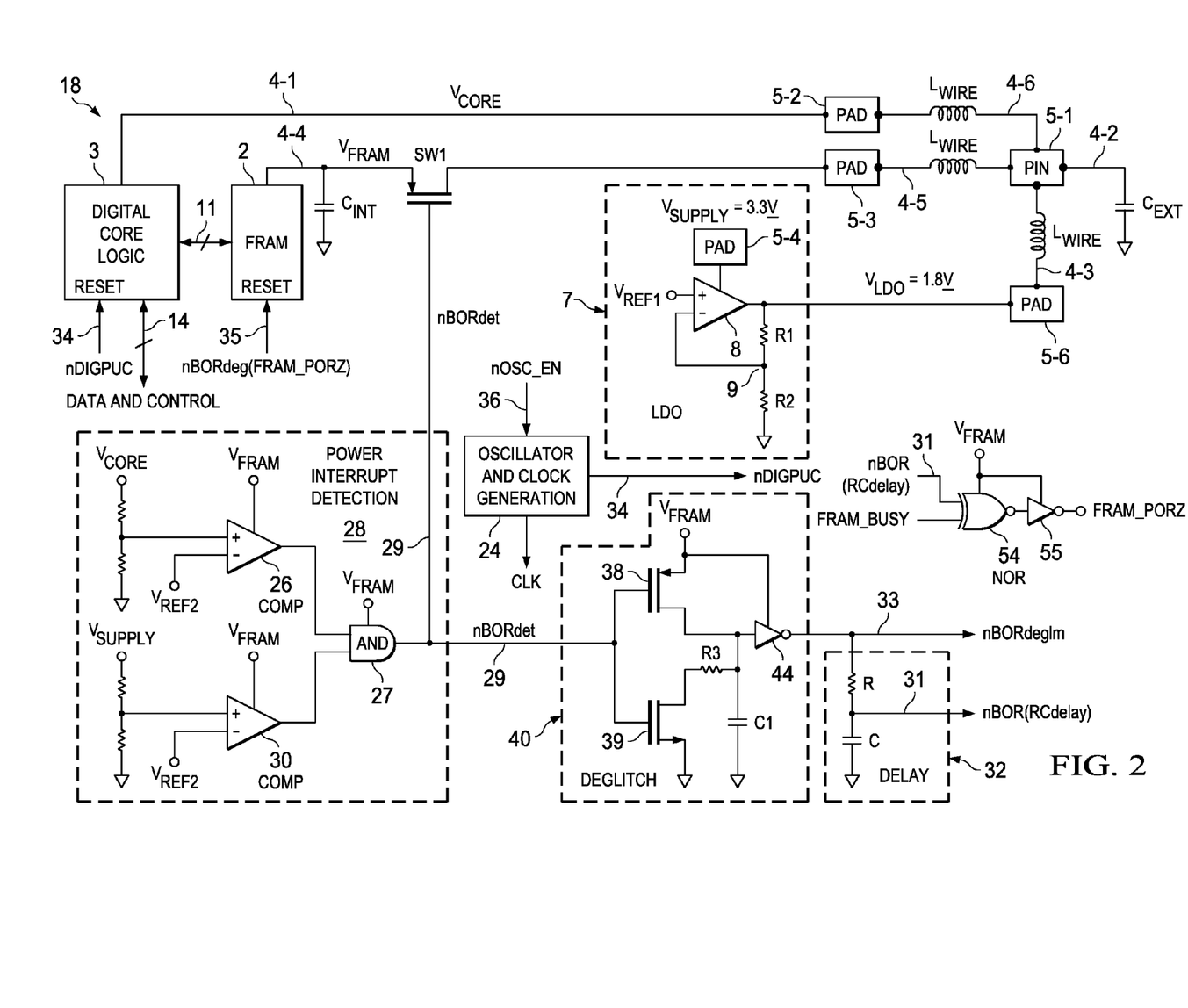
FIG. 2 is a diagram of a FRAM memory system including a FRAM and digital core logic and also including improved circuitry and an improved technique for providing temporary backup power or BOR (brown-out recovery) for the digital core logic and embedded FRAM during a power interruption.

The described bonding wire isolation, FRAM supply voltage isolation switch, and power supply interruption detecting system operates to provide a fast, efficient, and inexpensive way of preventing data corruption in FRAM memory systems. Referring to FIG. 2, a digital system 18 including an embedded FRAM 2 also includes digital core logic 3 coupled by means of a bidirectional bus 11 to FRAM 2. In one example, FRAM 2 is organized as a 8192 word by 8 bit FRAM. FRAM 2 may be a conventional FRAM which includes internal logic circuitry that functions to store and finish execution of any already-initiated read, write, and re-write instructions that FRAM 2 has already received from digital core logic 3 before the operation of digital core logic 3 has been halted (by halting its clock input signal).

Digital core logic 3 is coupled to an external digital system (not shown) by means of bidirectional data and control bus 14. FRAM 2 is powered by a supply voltage $V_{FRAM}$ on conductor 4-4, which is coupled to the source of a P-channel MOS switch transistor SW1. An internal storage capacitor $C_{INT}$ is connected between conductor 4-4 and ground. The drain of switch transistor SW1 is connected to a conductive bonding pad 5-3. Bonding pad 5-3 is connected to an external conductive bonding pad or pin 5-1 of an integrated circuit package by means of a bonding wire 4-5, which has an associated inductance $L_{WIRE}$. The gate of transistor SW1 is connected by conductor 29 to the output of a power interrupt detection circuit 28, which generates a "BOR" (Brown-Out Reset) signal nBORdet (see waveforms in FIG. 3).

Digital core logic 3 is separately powered by the supply voltage $V_{CORE}$ on conductor 4-1. Conductor 4-1 is coupled to a conductive bonding pad 5-2 on the integrated circuit chip on which system 18 is fabricated. Bonding pad 5-2 is connected by a bonding wire 4-6 to external conductive pad or pin 5-1. Bonding wire 4-6 has an associated inductance $L_{WIRE}$. All of the circuitry shown in FIG. 2 except package pin 5-1 and external storage capacitor $C_{EXT}$ are included on a single chip.

A desired value of supply voltage $V_{FRAM}$ is applied to FRAM 2 when switch transistor SW1 is turned on. The desired value of $V_{FRAM}$ is equal to the LDO output voltage $V_{LDO}$ on bonding pad 5-6. $V_{LDO}$ is conducted to package pin 5-1 by means of a bonding wire 4-3, which has an associated inductance $L_{WIRE}$. LDO voltage regulator 7 includes an operational amplifier 8 having its (+) input coupled to a reference voltage $V_{REF1}$ and its (−) input coupled by conductor 9 to the junction between the voltage divider including resistor R1 and resistor R2. The output of amplifier 8 applies the regulated output voltage $V_{LDO}$ across resistive voltage divider R1,R2 to provide feedback to the (−) input of amplifier 8 so as to regulate $V_{LDO}$ to reference voltage $V_{REF}$. $V_{LDO}$ is coupled by bonding pad 5-6 and bonding wire 4-3 to apply $V_{LDO}$, plus or minus any voltage drop across the inductance $L_{WIRE}$ of bonding wire 4-3, to conductive pin 5-1. Each of bonding wires 4-3, 4-5, and 4-6 in FIG. 2 has a significant amount of inductance, which for each bonding wire is represented by $L_{WIRE}$.

In this example, amplifier 8 of LDO circuit 7 is powered by a main supply voltage $V_{SUPPLY}$ which is applied to conductive bonding pad 5-4. It is necessary to use LDO 7 to generate the 1.8 volt supply voltage because the supply voltage for digital core 3 and FRAM 2 must not exceed 2.0 V. $V_{REF1}$ on the (+) input of amplifier 8 is equal to 1.8 volts in this example, so $V_{LDO}$ is regulated to 1.8 volts. Therefore, the FRAM supply voltage $V_{FRAM}$ is also equal to 1.8 volts when switch transistor SW1 is turned on.

Conductive pin 5-1 is connected by conductor 4-2 to a very large external storage/bypass capacitor $C_{EXT}$, which in this example may have a capacitance of roughly 2.2 microfarads. External storage capacitor $C_{EXT}$ is large enough to supply operating power for digital core logic 3 during the initial portion of the time interval in which $V_{CORE}$ is interrupted. The relatively small storage capacitor $C_{INT}$ coupled between $V_{FRAM}$ conductor 4-4 and ground holds an amount of charge sufficient to provide operating power for FRAM 2 during a 200 ns interval while $V_{CORE}$ is interrupted. In this example, $C_{INT}$ may be roughly 10 times smaller than the prior art external bypass capacitor (i.e., $C_{EXT}$ in FIG. 1A) utilized to supply power to FRAM 2 and digital core logic 3 during the response of the FRAM system 18 to a memory supply voltage interruption.

To control the gate of P-channel switch transistor SW1, fast comparator circuitry in power interrupt detection circuit 28 operates to detect when $V_{CORE}$ falls below a minimum FRAM supply voltage threshold level $V_{THFRAm}$, which may be approximately 1.7 volts in this example. If $V_{CORE}$ falls below 1.7 volts, then FRAM 2 and digital core logic 3 can not operate without causing corruption of data in FRAM 2.

Power interrupt detection circuit 28 includes a comparator 26 having its (+) input coupled to the junction between two resistors of a voltage divider that is coupled between $V_{CORE}$ and ground. The (−) input of comparator 26 is coupled to a reference voltage $V_{REF2}$. The output of comparator 26 is connected to one input of an AND gate 27, the output of which is connected to conductor 29. Power interrupt detection circuit 28 also includes a comparator 30 having its (+) input coupled to the junction between two resistors of a voltage divider coupled between $V_{SUPPLY}$ and ground. The (−) input of comparator 30 is coupled to $V_{REF2}$. The output of comparator 30 is connected to the other input of AND gate 27. Comparators 26 and 30 and AND gate 27 are powered by $V_{FRAM}$. It should be understood that, for "negative logic", AND gate 27 in FIG. 2 actually performs a logical ORing function on the signals generated at the outputs of comparators 26 and 30. Therefore, nBORdet will be generated if either of $V_{CORE}$ and/or $V_{SUPPLY}$ falls. (If $V_{SUPPLY}$ falls, that may cause $V_{CORE}$ to also fall.)

The BOR (Brown-Out Reset) circuitry including comparators 26 and 30 and AND gate 27 must to be able to function while the power supply voltage $V_{SUPPLY}$ is interrupted, and therefore, comparators 28 and 30 are powered by FRAM supply voltage $V_{FRAM}$. AND gate 27 also is powered by $V_{FRAM}$. The BOR circuitry needs to be able to isolate FRAM 2 from $C_{EXT}$ by turning P-channel switch transistor SW1 off. To achieve this comparators 26 and 30 and AND gate 27 operate to generate the interruption detect signal nBORdet, which controls switch transistor SW1. A "deglitched" version nBORdeglm of nBORdet is generated by a deglitching circuit 40, which includes transistors 38 and 39, resistor R3, capacitor C1, and inverter 44. The signal nBORdet signal on conductor 29 also is applied to the control electrode of a P-channel MOS transistor 38, the source of which is connected to $V_{FRAM}$. The drain of transistor 38 is connected to the input of an inverter 44 and to one terminal of a resistor R3 and a capacitor C1.

Inverter 44 is powered by $V_{FRAM}$. The other terminal of resistor R3 is connected to the drain of a N-channel transistor 39 having its source connected to ground. The gate of transistor 39 is connected to conductor 29. The other terminal of capacitor C1 is connected to ground. The output of inverter 44 is connected to conductor 33, on which deglitched signal nBORdeglm is generated. An RC circuit 32 including a resistor R coupled between the output 33 of inverter 44 and a conductor 31 and a capacitor C coupled between conductor 31 and ground generates a filtered or "deglitched" signal nBORdeg on conductor 31 which is representative of the "Brown-Out detection" signal nBORdet.

When a power interruption is detected, power interrupt detection circuit 28 communicates indirectly with digital core logic 3 and FRAM 2 via conductor 29, and causes them to operate so as to (1) prevent any new FRAM read and write operations from being started, and (2) to complete any already-started read, write, and re-write operations, to thereby prevent corruption. Before FRAM 2 is reset, RC delay circuit 32 generates nBOR(RCdelay) from nBORdet to generate a time window of at least 200 ns (nanoseconds) to ensure that prior FRAM read and write operations (that were already started prior to the leading edge of nBORdet) are completed so that no data in FRAM 2 is corrupted. RC delay circuit 32 produces or "inserts" an RC delay in the nBORdet signal so as to generate a delayed signal nBORdeg(RCdelay) that has a delay of at least 200 ns relative to the nBORdet signal.

Oscillator and clock generation circuit 24 operates in response to an oscillator enable signal nOSC_EN (see FIG. 3) on conductor 36 to produce a high frequency system clock signal CLK and a signal nDIGPUC (see FIG. 3) on conductor 34. The oscillator enable signal nOSC_EN on conductor 36 may be the logical complement of the nBORdeglm signal on conductor 33. The signal nDIGPUC is connected by conductor 34 to a reset input of digital core logic 3. A NOR gate 54 has one input connected to the signal nBOR(RCdelay). The output of NOR gate 54 is connected to the input of an inverter 55, the output of which generates a signal FRAM_PORZ, which is used to generate the FRAM reset signal nBORdeg (FRAM_PORZ) on conductor 35. NOR gate 54 and inverter 55 are powered by $V_{FRAM}$. The other input of NOR gate 54 receives a signal FRAM_BUSY which indicates when FRAM 2 is being operated normally.

In this example, when the onset of a power interruption event is detected by power interrupt detection circuit 28, switch transistor SW1 is turned off, and $V_{FRAM}$ is maintained above approximately 1.5 volts only by the charge stored in $C_{INT}$ for at least a 200 ns interval determined by delay circuit 32. The value of $C_{INT}$ is designed so that it is able to supply the current required by FRAM 2 while maintaining the value of $V_{FRAM}$ above approximately 1.5 volts for at least the 200 ns interval. The amount of charge stored in the internal capacitor $C_{INT}$ (i.e., how much current and voltage must be supplied by it to FRAM for 200 ns) is a known quantity, so the value of $C_{INT}$ required for it to deliver an amount of current that maintains $V_{FRAM}$ at a voltage greater than 1.5 volts for at least 200 ns may be easily determined. $C_{INT}$ may, for example, be equal to roughly 2 nF (nanofarads).

It should be understood that the $V_{CORE}$ supply voltage generated on conductor 4-1 in response to LDO 7 output voltage $V_{LDO}$ is substantially isolated from the effects on FRAM 2 of transient signals by means of the above-mentioned bonding wire inductances $L_{WIRE}$. Also, internal switch transistor SW1 isolates the $V_{FRAM}$ voltage on conductor 4-4 from LDO output voltage $V_{LDO}$ during any detected power interruption. It should be appreciated that the fact that bonding wire and its wire bonds to package pin 5-1 and the various on-chip bonding pads are used is very important to achieving the isolation needed between FRAM 2 and the transient power signals caused by power interruptions. The separate $V_{FRAM}$ supply voltage conductor 4-4 actually reduces the loading by FRAM 2 on the charge stored in $C_{INT}$ while the separate $V_{FRAM}$ supply voltage conductor 4-4 and $V_{CORE}$ supply voltage conductor 4-1 are coupled together when switch transistor SW1 is being turned on. This is because whenever digital core logic 3 is switching, various parasitic capacitances are being charged and discharged. Also, associated large transient or instantaneous currents are being generated and drawn by digital core logic 3 and FRAM 2 from capacitances (including external capacitor $C_{EXT}$ and internal capacitor $C_{INT}$) associated with supply voltage conductors 4-1 and 4-4.

The bonding wire isolation of the voltage $V_{FRAM}$ on conductor 4-4 due to its bonding wire inductance $L_{WIRE}$ effectively substantially reduces the transient loading effects caused by the switching of digital core logic 3. Whenever FRAM 2 is electrically coupled by switch transistor SW1 to external pin 5-1, fast supply voltage transients are resisted or blocked by the bonding wire inductance $L_{WIRE}$, and this may avoid "stealing" of charge from $C_{INT}$, which is one reason why the transient isolation is required. This is because the bonding wire inductance $L_{WIRE}$ resists change of the current flowing through it tends to act as current source for a short amount of time. The effect of that is to provide an amount of electrical isolation between the terminals of the inductance $L_{WIRE}$ for a short amount of time. Since the bonding wire inductance $L_{WIRE}$ resists change of the current flowing through the bonding wire, the impedance of the bonding wire inductance $L_{WIRE}$ is relatively high and prevents undesirable transient currents from flowing from one pin or bonding pad to another. Whenever switch SW1 needs to be turned off, what happens during the very short turn-off interval (which, for example, may occur if bonding pad 5-1 is short-circuited to ground), the bonding wire inductances prevent transient currents from being "stolen" from capacitances associated with various bonding pads/pins because such transient currents are impeded by the bonding wire inductances $L_{WIRE}$. That is because the bonding wire inductances $L_{WIRE}$ resist any change in the current flowing through the bonding wires, and that effectively prevents charge being "stolen" from $C_{INT}$ due to switching operations occurring in digital core logic 3 during the SW1 turn-of interval. This is very important because it allows the size of the internal storage capacitance $C_{INT}$ to be significantly reduced. Consequently, the overall integrated circuit chip size and cost is significantly reduced.

Figure 3:
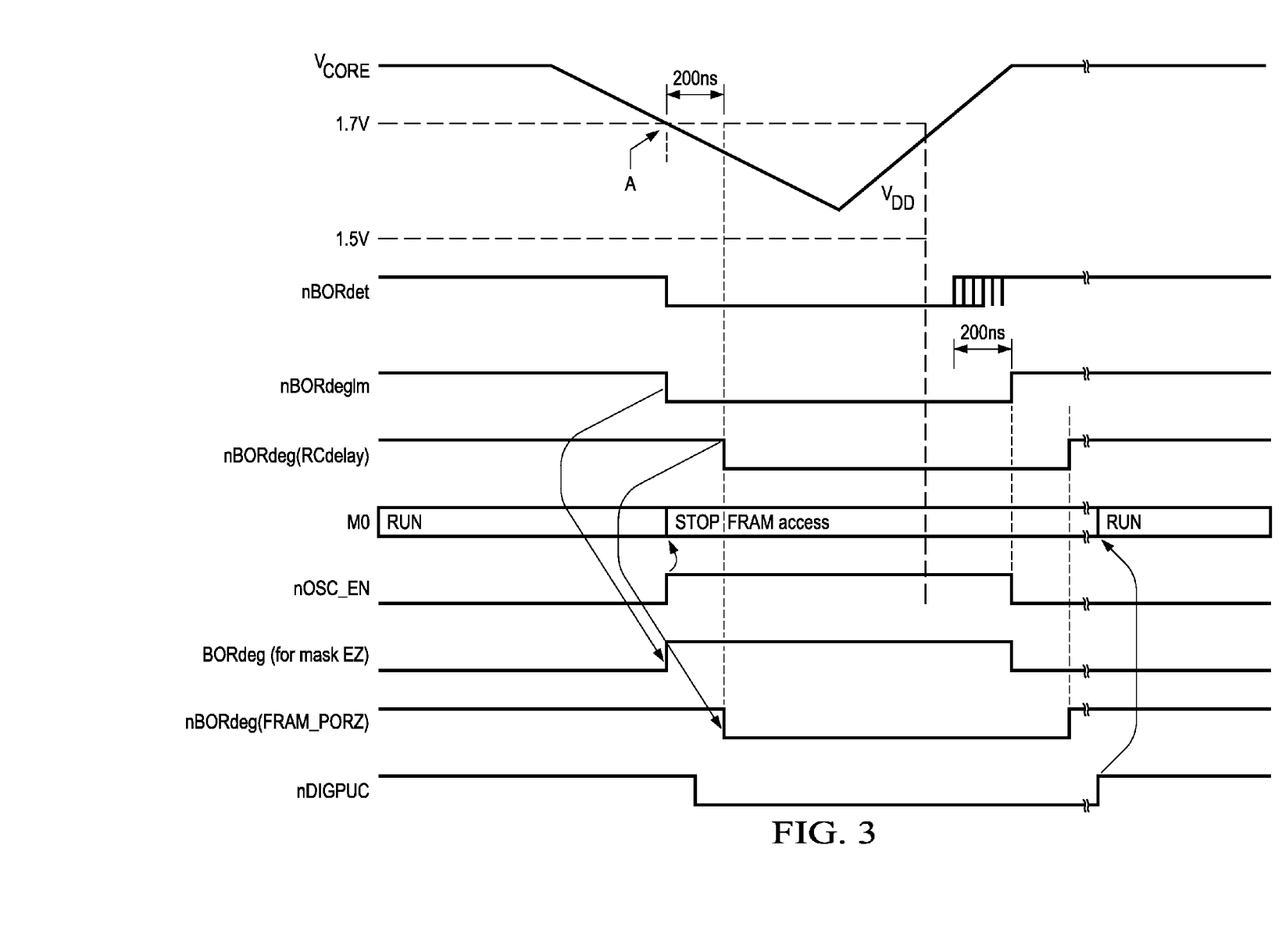
FIG. 3 is a diagram showing waveforms of signals associated with the system of FIG. 2.

FIG. 3 shows waveforms of the various signals shown in FIG. 2. The falling and recovery of the $V_{CORE}$ waveform in FIG. 3 on bonding pad 5-2 and conductor 4-1 represents a simulation due to a short-circuiting (e.g., to ground) of the voltage on pin 5-1 on which the $V_{LDO}$ voltage is applied. In this example, $V_{CORE}$ undergoes a power interruption in which it falls from its normal 1.8 volts $V_{LDO}$ level to approximately 1.55 volts and then recovers back to 1.8 volts. However, the waveform of supply voltage $V_{CORE}$ on conductor 4-1 as shown in FIG. 3 illustrates an "interruption" of $V_{CORE}$, which could be due to any of a number of different causes. $V_{CORE}$ will be interrupted if $V_{SUPPLY}$ falls enough to cause the (+) input of comparator 30 to fall below 1.7 volts. Normally, LDO circuit 7 generates a 1.8 volt $V_{LDO}$ level that is conducted via conductors 4-3, external package pin 5-1, bonding pad 5-2, and conductor 4-1 to supply operating power to digital core logic 3. If switch transistor SW1 is on, $V_{LDO}$ also is conducted via bonding pad 5-3 and conductor 4-4 to supply power to FRAM 2.

In FIG. 3, the falling edge of $V_{CORE}$ at the beginning of a power interruption reaches the 1.7 volts threshold level at point "A", continues falling, and then recovers along the rising edge of $V_{CORE}$. The indicated 1.5 volts level of $V_{CORE}$ represents the minimum supply voltage level at which both digital core logic 3 and FRAM 2 can reliably operate without corrupting data.

As soon as power interrupt detection circuit 28 in FIG. 2 detects that $V_{CORE}$ has fallen below a threshold value $V_{TH\ FRAM}$ equal to 1.7 volts at point "A" in FIG. 3, P-channel switch transistor SW1 is turned off, thereby electrically isolating FRAM 2 from the falling $V_{CORE}$ supply voltage. This prevents $C_{INT}$ from being discharged by the $V_{CORE}$ voltage on conductor 4-1 falling below the 1.7 volt level, and thereby allows $C_{INT}$ to supply operating current through conductor 4-4 to FRAM 2 while maintaining $V_{FRAM}$ above 1.5 volts during the indicated 200 ns interval even while $V_{CORE}$ is below its required minimum level. The delayed signal nBORdeg(RCdelay) is generated on conductor 31 by resistor R and capacitor C in delay circuit 32 in response to the nBORdet signal generated on conductor 29. The delay circuit 32 (including the resistor and capacitor which generate the RC delay) is an entirely analog circuit and does not rely on digital logic. This may be important because the digital logic circuitry is inherently less reliable for power control applications, whereas the RC delay circuit 32 is simple and robust. The deglitched signal nBORdeglm is produced on conductor 33 by resistor R1 and capacitor C1, transistors 38 and 39, and inverter 44 of deglitch circuit 40 in response to the nBORdet signal on conductor 29.

The oscillator enable signal nOSC_EN, which is the logical complement of nBORdeglm, appears on conductor 36 in FIG. 2 in response to, and at the same time as, the falling edge of the nBORdeglm waveform. The signal nOSC_EN may be controlled by simple combinational logic circuitry for normal operation. The FRAM reset signal nBORdeg(FRAM_PORZ) is generated by NOR gate 54 and inverter 55 in FIG. 2. The signal nDIGPUC which resets digital core logic 3 is generated on conductor 34 by oscillator and clock generation circuit 24. The falling edge of nDIGPUC occurs after the rising edge of nOSC_EN but prior to the falling edge of nBORdeg (FRAM_PORZ).

When the low level of nBORdeglm is detected, oscillator circuitry 24 in FIG. 2 is stopped/halted, and transistor switch SW1 is opened. Stopping the oscillator circuitry in block 24 blocks access of digital core logic 3 to FRAM 2. All ongoing FRAM read and write transactions started before the falling edge of nBORdeglm have been completed before the falling edge of nBORdeg(FRAM_PORZ), which resets FRAM 2. When digital core logic 3 is reset as a result of the oscillator in block 24 being stopped, digital core 3 cannot start any new read and write operations. However, conventional circuitry in FRAM 2 remains active long enough while switch SW1 is open, with the voltage $V_{FRAM}$ and current provided by internal storage capacitor $C_{INT}$ via conductor 4-4, to nevertheless finish all ongoing read and write operations in FRAM 2.

The comparator circuitry in power interrupt detection circuit 28 generates nBORdet, which turns off the switch transistor SW1 that couples FRAM 2 to $V_{CORE}$ as soon as $V_{CORE}$ falls below the 1.7 volt threshold point labeled "A" in FIG. 3. This allows FRAM 2 to continue and complete any on-going read and write operations with sufficient current and voltage being supplied by $C_{INT}$ for at least the next 200 ns.

The falling edge of nBORdeglm occurs at the same time that nBORdet turns switch transistor SW1 turns off. The signal nBORdet is used to generate the corresponding deglitched signal nBORdeglm utilized to generate nOSC_EN to disable oscillator and clock generation circuit 24, which prevents digital core logic 3 from starting any new read and write operations in FRAM 2 until after the rising edge of nDIGPUC occurs.

The curved arrow in FIG. 3 leading from the nBORdeglm waveform to the oscillator enable waveform nOSC_EN indicates the time at which oscillator and clock generation circuit 24 is disabled and stops operation of digital core logic 3. The falling edge of the signal nDIGPUC resets digital core logic 3. Access to FRAM 2 is blocked after the "FRAM access" point indicated in FIG. 3, and further read and write operations in FRAM 2 are stopped while ongoing read and write operations are completed during the 200 ns interval. Then FRAM 2 is disabled in response to the rising edge of nBORdeg(FRAM_PORZ).

In FIG. 3, and other curved arrow leads from the falling edge of the delayed signal nBORdeg(RCdelay) to the falling edge of FRAM reset signal nBORdeg(FRAM_PORZ), which resets FRAM 2.

At the beginning, i.e., at the falling edge, of the nBORdet and nBORdeglm signals (FIG. 3), the oscillator-based clock signals produced by the oscillator circuitry in block 24 are halted (even though power is still being supplied by $C_{EXT}$, to digital core logic 3). This causes the signal nDIGPUC to stop digital core logic 3 from initiating any further FRAM read and write operations. Then, during the following 200 ns interval, any already-initiated instructions in FRAM 2 are completed by the previously mentioned conventional logic circuitry contained in FRAM 2.

After the $V_{CORE}$ waveform rises back above 1.7 volts, oscillator and clock generation circuit 24 is restarted by the trailing edge of nOSC_EN. FRAM 2 is reset, i.e. turned back on, by the trailing edge of nBORdeg(FRAM_PORZ), and then digital core logic 3 is restarted by the trailing edge of nDIGPUC.

To summarize, LDO 7, FRAM 2, and digital core logic 3, and LDO 7 are electrically isolated from fast supply voltage transients by the inductances $L_{WIRE}$ of the separate bonding wires 4-3, 4-5, and 4-6, respectively, to the external package pin 5-1. Internal switch transistor SW1 is coupled between FRAM 2 and the external package pin 5-1 and allows a relatively small internal storage capacitor $C_{INT}$ to hold sufficient charge to provide operating power to FRAM 2 during a power interruption. Any further FRAM read and write operations are immediately blocked, by stopping/halting the clock signal to digital core logic 3 in response to detection of the onset of a power interruption. A delay interval is provided for a sufficient duration to enable any ongoing FRAM read and write operation to be completed while the internal storage capacitor $C_{INT}$ continues to supply operating power to FRAM 2. A sufficiently large external storage capacitor $C_{EXT}$ is provided to enable digital core logic 3 to perform its normal functions.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the basic idea of the invention could be used for other kinds of volatile RAM (random access memory).

What is claimed is:

1. An integrated circuit FRAM (ferroelectric random access memory) system comprising:
 (a) a FRAM;
 (b) a digital circuit coupled to the FRAM for controlling read and write operations in the FRAM;
 (c) a first supply voltage conductor coupled to the digital circuit for applying a first supply voltage to the digital circuit and also coupled to a conductive pin that conducts a second supply voltage and is coupled to an external capacitor so that a DC value of the first supply voltage is substantially equal to a DC value of the second supply voltage;
 (d) a second supply voltage conductor coupled to the FRAM for applying a third supply voltage to the FRAM;
 (e) a switch circuit having a first terminal coupled by the second supply voltage conductor to an internal capacitor and a second terminal coupled to the conductive pin so that a DC value of the third supply voltage is substantially equal to the DC value of the second supply voltage when the switch circuit is closed;
 (f) a power interrupt detection circuit for detecting an interruption of the first supply voltage to produce an interruption signal and turning the switch circuit off and for causing the digital circuit to operate in response to the interruption signal to prevent initiating of new read and write operations and to allow completion of ongoing read and write operations in the FRAM in response to the detecting of the interruption, wherein the internal capacitor maintains the third supply voltage above a predetermined level during the completing of ongoing read and write operations; and
 (g) delay circuitry for producing a delayed signal for resetting the FRAM after the ongoing read and write operations have been completed.

2. The FRAM system of claim 1 including a first bonding wire coupling the second terminal of the switch circuit to the conductive pin, wherein the first bonding wire has a sufficiently large inductance to effectively prevent transmission of high-speed transient signals between the second supply voltage conductor and the conductive pin.

3. The FRAM system of claim 2 wherein the first supply voltage conductor is coupled to the conductive pin by a second bonding wire having a sufficiently large inductance to effectively prevent transmission of high-speed transient signals between the first supply voltage conductor and the conductive pin.

4. The FRAM system of claim 3 including a voltage regulator producing the second supply voltage.

5. The FRAM system of claim 4 wherein the voltage regulator receives a main supply voltage and wherein an output of the voltage regulator is coupled to the conductive pin by a third bonding wire having a sufficiently large inductance to effectively prevent transmission of high-speed transient signals between the voltage regulator and the conductive pin.

6. The FRAM system of claim 1 wherein the capacitance of the internal capacitor is substantially smaller than the capacitance of the external capacitor.

7. The FRAM system of claim 6 wherein the internal capacitor supplies power to the FRAM while the switch circuit is off.

8. The FRAM system of claim 1 wherein the external capacitor maintains the first supply voltage above the predetermined level during the completing of ongoing read and write operations.

9. The FRAM system of claim 1 wherein the power interrupt detection circuit includes a first comparator having a first input coupled to receive a voltage representative of the first supply voltage and a second input coupled to a reference voltage representative value of the first supply voltage at which the first supply voltage becomes interrupted.

10. The FRAM system of claim 9 wherein the power interrupt detection circuit includes a second comparator having a first input coupled to receive a voltage representative of the main supply voltage and a second input coupled to the reference voltage.

11. The FRAM system of claim 1 including deglitching circuitry for removing glitches from the interruption signal to generate a corresponding deglitched interruption signal a first level of which is utilized to stop clocking of the digital circuit to prevent the initiating of new read and write operations and to cause a delay circuit to provide a predetermined delay for the FRAM to complete the ongoing read and write operations.

12. The FRAM system of claim 1 wherein the switch circuit is an MOS transistor having its gate coupled to an output of the power interrupt detection circuit.

13. The FRAM system of claim 10 wherein the power interrupt detection circuit includes a gate for performing a logical ORing function on output signals of the first and second comparators to generate the interruption signal.

14. The FRAM system of claim 1 wherein the delay circuitry causes the delayed signal to initiate resetting the FRAM at least approximately 200 ns after a leading edge of the interruption signal.

15. A method for preventing corruption of data in a FRAM (ferroelectric random access memory), the method comprising:
(a) applying a regulated supply voltage to a conductive pin;
(b) coupling the conductive pin to a first terminal of a switch and coupling a second terminal of the switch to a power terminal of the FRAM so that a DC value of a FRAM supply voltage is substantially equal to a DC value of the regulated supply voltage when the switch is closed, and also coupling the conductive pin to a power terminal of a digital circuit which controls read and write operations in the FRAM, so that a DC value of a digital circuit supply voltage is substantially equal to the DC value of the regulated supply voltage;
(c) detecting an interruption of the digital circuit supply voltage to produce an interruption signal, and in response to the detecting, both turning the switch off and preventing initiation of new read and write operations during the interruption; and
(d) maintaining the FRAM supply voltage above a predetermined level by means of an internal capacitor during a predetermined time interval while completing ongoing read and write operations and maintaining the digital circuit supply voltage above a predetermined level by means of an external capacitor during the predetermined time interval.

16. The method of claim 15 wherein step (b) includes coupling the conductive pin to the second terminal of the switch by means of a first bonding wire so that an inductance of the first bonding wire effectively prevents transmission of high-speed transient signals between the FRAM and the conductive pin.

17. The method of claim 16 wherein step (b) includes coupling the conductive pin to the power terminal of the digital circuit by means of a second bonding wire so that an inductance of the second bonding wire effectively prevents transmission of high-speed transient signals between the digital circuit and the conductive pin.

18. The method of claim 17 wherein step (a) includes generating the regulated supply voltage by means of a voltage regulator producing the regulated supply voltage in response to a main supply voltage, the method including coupling the second supply voltage to the conductive pin by means of a third bonding wire having a sufficiently large inductance to effectively prevent transmission of high-speed transient signals between the voltage regulator and the conductive pin.

19. The method of claim 15 wherein the method includes comparing a voltage representative of the digital circuit supply voltage with a reference voltage representative value of the digital circuit supply voltage at which the digital circuit supply voltage becomes interrupted.

20. A system for preventing corruption of data in a FRAM (ferroelectric random access memory), comprising:
(a) means for applying a regulated supply voltage to a conductive pin;
(b) means for coupling the conductive pin to a first terminal of a switch and coupling a second terminal of the switch to a power terminal of the FRAM so that a DC value of a FRAM supply voltage is substantially equal to a DC value of the regulated supply voltage when the switch is closed, and also for coupling the conductive pin to a power terminal of a digital circuit, which controls read and write operations in the FRAM, so that a DC value of a digital circuit supply voltage is substantially equal to the DC value of the regulated supply voltage;
(c) means for detecting an interruption of the digital circuit supply voltage to produce an interruption signal, and in response to the detecting, both turning the switch off and preventing initiation of new read and write operations during the interruption; and
(d) means for maintaining the FRAM supply voltage above a predetermined level by means of an internal capacitor during a predetermined time interval while completing ongoing read and write operations and maintaining the digital circuit supply voltage above a predetermined level by means of an external capacitor during the predetermined time interval.

* * * * *